United States Patent
Miyahara et al.

(10) Patent No.: US 9,857,739 B2
(45) Date of Patent: Jan. 2, 2018

(54) COATING APPARATUS, COATING METHOD, FIXING MEMBER MANUFACTURING APPARATUS, FIXING MEMBER MANUFACTURING METHOD AND FIXING MEMBER

(71) Applicant: CANON KABUSHIKI KAISHA, Tokyo (JP)

(72) Inventors: Yasuhiro Miyahara, Tokyo (JP); Yuji Hasegawa, Toride (JP); Katsuya Abe, Tokyo (JP)

(73) Assignee: CANON KABUSHIKI KAISHA, Tokyo (JP)

( * ) Notice: Subject to any disclaimer, the term of this patent is extended or adjusted under 35 U.S.C. 154(b) by 207 days.

(21) Appl. No.: 14/063,234

(22) Filed: Oct. 25, 2013

(65) Prior Publication Data
US 2014/0120352 A1   May 1, 2014

(30) Foreign Application Priority Data
Oct. 29, 2012   (JP) .................................. 2012-237940

(51) Int. Cl.
*B05C 11/02* (2006.01)
*G03G 15/20* (2006.01)
*G03F 7/18* (2006.01)

(52) U.S. Cl.
CPC ........ *G03G 15/2025* (2013.01); *B05C 11/021* (2013.01); *B05C 11/025* (2013.01);
(Continued)

(58) Field of Classification Search
CPC .......... B05C 5/00–5/0295; B05C 1/00–1/165; B05C 11/02–11/026; G03F 7/18
See application file for complete search history.

(56) References Cited

U.S. PATENT DOCUMENTS 5,455,077 A * 10/1995 Yamamoto ......... G03G 15/0233
                                                      118/230
5,525,775 A   6/1996 Setoriyama et al.
(Continued)

FOREIGN PATENT DOCUMENTS

CN   102387869 A   3/2012
JP   2-284675 A   11/1990
(Continued)

OTHER PUBLICATIONS

First Office Action in Chinese Application No. 201310518379.0 (dated Oct. 28, 2015).
(Continued)

*Primary Examiner* — Dah-Wei D. Yuan
*Assistant Examiner* — Stephen A Kitt
(74) *Attorney, Agent, or Firm* — Fitzpatrick, Cella, Harper & Scinto

(57) ABSTRACT

A coating apparatus configured to coat a peripheral surface of an endless member with a coating liquid, includes: a holding member configured to hold the endless member; an impregnation member configured to be impregnated with the coating liquid and configured to coat the endless member with the coating liquid in contact with the endless member; a nozzle member configured to eject the coating liquid onto the endless member; a rotating mechanism configured to rotate the holding member relative to the impregnation member and the nozzle member; and a moving mechanism configured to move the holding member relative to the impregnation member and the nozzle member so that the coating liquid is ejected from the nozzle member onto the endless member in a region where the coating liquid is already coated by the impregnation member.

7 Claims, 5 Drawing Sheets

(52) U.S. Cl.
CPC ....... *G03F 7/18* (2013.01); *G03G 2215/2035* (2013.01); *Y10T 428/31544* (2015.04)

(56) References Cited

U.S. PATENT DOCUMENTS

| | | | |
|---|---|---|---|
| 5,760,880 A * | 6/1998 | Fan | B41C 1/05 355/67 |
| 8,524,315 B2 | 9/2013 | Seko et al. | |
| 8,909,119 B2 | 12/2014 | Miyahara et al. | |
| 8,919,277 B2 | 12/2014 | Tokumoto et al. | |
| 9,110,411 B2 | 8/2015 | Akiyama et al. | |
| 9,134,664 B2 | 9/2015 | Miura et al. | |
| 2003/0000404 A1* | 1/2003 | Vrotacoe | B41N 10/02 101/379 |
| 2008/0152401 A1* | 6/2008 | Kimura | G03G 15/2053 399/328 |
| 2013/0202333 A1 | 8/2013 | Sugimoto | |
| 2014/0107250 A1 | 4/2014 | Maeda et al. | |
| 2014/0116599 A1 | 5/2014 | Miyahara et al. | |
| 2014/0116603 A1 | 5/2014 | Akiyama et al. | |
| 2014/0116612 A1 | 5/2014 | Akiyama et al. | |

FOREIGN PATENT DOCUMENTS

| | | |
|---|---|---|
| JP | 4-44075 A | 2/1992 |
| JP | 9-19657 A | 1/1997 |
| JP | 2001-132732 A | 5/2001 |
| JP | 2004-295052 A | 10/2004 |
| JP | 2005-172885 A | 6/2005 |
| JP | 2006-055778 A | 3/2006 |
| JP | 2007-144292 A | 6/2007 |
| JP | 2007-252976 A | 10/2007 |
| JP | 2008-250164 A | 10/2008 |
| JP | 2010-143118 A | 7/2010 |
| JP | 4720953 B1 | 7/2011 |

OTHER PUBLICATIONS

Akiyama et al., U.S. Appl. No. 14/063,229, filed Oct. 25, 2013.
Miyahara et al., U.S. Appl. No. 14/064,328, filed Oct. 28, 2013.
Miyahara et al., U.S. Appl. No. 14/064,335, filed Oct. 28, 2013.
Akiyama et al., U.S. Appl. No. 14/060,936, filed Oct. 23, 2013.
Miura et al., U.S. Appl. No. 14/158,098, filed Jan. 17, 2014.
Maeda et al., U.S. Appl. No. 14/104,765, filed Dec. 12, 2013.
Notification of Reason for Rejection in Japanese Application No. 2013-180967 (dated Apr. 11, 2017).
Office Action in Vietnamese Application No. 1-2013-03403 (dated Feb. 27, 2017).

* cited by examiner

COATING APPARATUS, COATING METHOD, FIXING MEMBER MANUFACTURING APPARATUS, FIXING MEMBER MANUFACTURING METHOD AND FIXING MEMBER

FIELD OF THE INVENTION AND RELATED ART

The present invention relates to a coating apparatus for coating a coating liquid, a coating method for coating the coating liquid, a fixing member manufacturing apparatus, a fixing member manufacturing method and a fixing member.

In a conventional fixing device (apparatus) mounted in an electrophotographic image forming apparatus such as a printer or a copying machine, a constitution in which a toner image formed on a recording material is fixed by the fixing member.

Further, in recent years, for the purpose of shortening a rise time of the fixing device, a fixing belt is employed as the fixing member. In the fixing device, a constitution in which the fixing belt having low thermal capacity is used, and the toner (image) on the recording material is heated by heat of a heater via the fixing belt is employed.

A basic structure of the fixing belt includes a thin cylindrical substrate (endless member) having low thermal capacitance, a rubber layer for following unevenness between the toner image and the recording material during fixing, and a primer layer having the function of bonding the cylindrical substrate and the rubber layer to each other. That is, from the cylindrical substrate toward an outer layer, the primer layer and the rubber layer are formed. Further, from the viewpoints of durability and a parting property, in some cases, an inner surface slidable layer is provided as an inner layer of the cylindrical substrate, and a fluorine-containing resin layer is provided as an outer layer of the cylindrical substrate via an adhesive.

During manufacturing of the fixing belt, when thickness non-uniformity is generated in the primer layer in a manufacturing stage in which a primer (coating liquid) is coated (applied), there is a fear that uneven gloss is generated on the image after the fixing. Further, in the case where a coating amount of the primer is insufficient, there is a fear that a problem of rubber layer peeling or the like is caused. For that reason, in the stage in which the primer is coated, a coating technique particularly with high accuracy has been required.

As a primer coating method, e.g., a spray coating (method), a dip coating (method), a brush coating (method) and the like have been conventionally studied.

However, in the spray coating, there is a fear that the coating liquid is scattered over a peripheral portion during a coating operation and loss of the coating liquid is great. Further, an atomization condition largely varies depending on a state of viscosity of the coating liquid, so that it is difficult to realize atomization itself when the coating liquid has high viscosity to some extent or more.

In the drop coating, sensitivity in control of a thickness of a coating film largely varies depending on physical properties of the coating liquid, such as the viscosity of the coating liquid, surface tension and density of the coating liquid, and a temperature of the coating liquid, and it is difficult to adjust the physical properties of the coating liquid. Further, attention is required to be given so as not to cause deposition (generation) of air bubbles in the coating liquid, and therefore it takes much time to effect dipping and pulling-up, so that there is a fear that operation efficiency is lowered.

Further, loss of dipping liquid is great, thus resulting in a factor leading to an increase in cost.

In the brush coating, a problem of a narrow degree of freedom of material selection in the spray coating and the dip coating is solved. However, when a brush is excessively moved quickly, there is a fear that so-called coating non-uniformity such that there is a portion where a primer solution is not placed or such that even when the primer solution is placed, an amount of the primer solution is small.

Therefore, in a rubber roller manufacturing method described in Japanese Laid-Open Patent Application (JP-A) 2008-250164, a primer layer is formed by ejecting a primer through a nozzle while rotating a cylindrical substrate and while moving the nozzle relative to the cylindrical substrate from an end to the other end of the cylindrical substrate with respect to an axial direction of the cylindrical substrate. Further, a blade is provided in the neighborhood of an outer peripheral surface of the cylindrical substrate, and adjusts a thickness of the primer layer of the primer ejected on the cylindrical substrate. The blade is moved together with the nozzle from the end to the other end of the cylindrical substrate with respect to the axial direction of the cylindrical substrate, and therefore the thickness adjustment of the primer layer by the blade is performed helically with respect to the cylindrical substrate.

However, in the rubber roller manufacturing method, a constitution in which the thickness of the primer layer formed on the cylindrical substrate by ejecting the primer through the nozzle is adjusted by the blade is employed, and therefore there is a fear that thickness non-uniformity is generated in the primer layer. That is, there is a fear that the thickness non-uniformity is generated in the primer layer along a contact locus (in helical shape) of a blade side end portion contacted to the cylindrical substrate (i.e., the blade end portion with respect to the axial direction of the cylindrical substrate).

SUMMARY OF THE INVENTION

According to an aspect of the present invention, there is provided a coating apparatus configured to coat a peripheral surface of an endless member with a coating liquid, comprising: a holding member configured to hold the endless member; an impregnation member configured to be impregnated with the coating liquid and configured to coat the coating liquid in contact with the endless member; a nozzle member configured to eject the coating liquid onto the endless member; a rotating mechanism configured to rotate the holding member relative to the impregnation member and the nozzle member; and a moving mechanism configured to move the holding member relative to the impregnation member and the nozzle member so that the coating liquid is ejected from the nozzle member onto the endless member in a region where the coating liquid is already coated by the impregnation member.

According to another aspect of the present invention, there is provided a coating method for coating a peripheral surface of an endless member with a coating liquid, comprising: a step of holding the endless member by a holding member; a step of coating the coating liquid by bringing an impregnation member, impregnated with the coating liquid, into contact with the endless member; a step of ejecting the coating liquid from a nozzle member onto the endless member; a step of rotating the holding member relative to the impregnation member and the nozzle member; and a step of moving the holding member relative to the impregnation member and the nozzle member so that the coating liquid is ejected from the nozzle member onto the endless member in a region where the coating liquid is already coated by the impregnation member.

According to another aspect of the present invention, there is provided a fixing member manufacturing apparatus configured to manufacture an endless fixing member including a substrate and a rubber layer provided on the substrate, comprising: a holding member configured to hold the substrate; an impregnation member configured to be impregnated with an adhesive liquid and configured to coat the adhesive liquid in contact with the substrate; a nozzle member configured to eject the adhesive liquid onto the substrate; a rotating mechanism configured to rotate the holding member relative to the impregnation member and the nozzle member; and a moving mechanism configured to move the holding member relative to the impregnation member and the nozzle member so that the adhesive liquid is ejected from the nozzle member onto the substrate in a region where the adhesive liquid is already coated by the impregnation member.

According to another aspect of the present invention, there is provided a fixing member manufacturing method for manufacturing an endless member including a substrate and a rubber layer provided on the substrate, comprising: a step of holding the endless member by a holding member; a step of coating the coating liquid by bringing an impregnation member, impregnated with the coating liquid, into contact with the endless member; a step of ejecting the coating liquid from a nozzle member onto the endless member; a step of rotating the holding member relative to the impregnation member and the nozzle member; and a step of moving the holding member relative to the impregnation member and the nozzle member so that the coating liquid is ejected from the nozzle member onto the endless member in a region where the coating liquid is already coated by the impregnation member.

According to another aspect of the present invention, there is provided a fixing member manufactured by the fixing member manufacturing apparatus.

According to a further aspect of the present invention, there is provided a fixing member manufactured by the fixing member manufacturing method.

These and other objects, features and advantages of the present invention will become more apparent upon a consideration of the following description of the preferred embodiments of the present invention taken in conjunction with the accompanying drawings.

Figure 4:
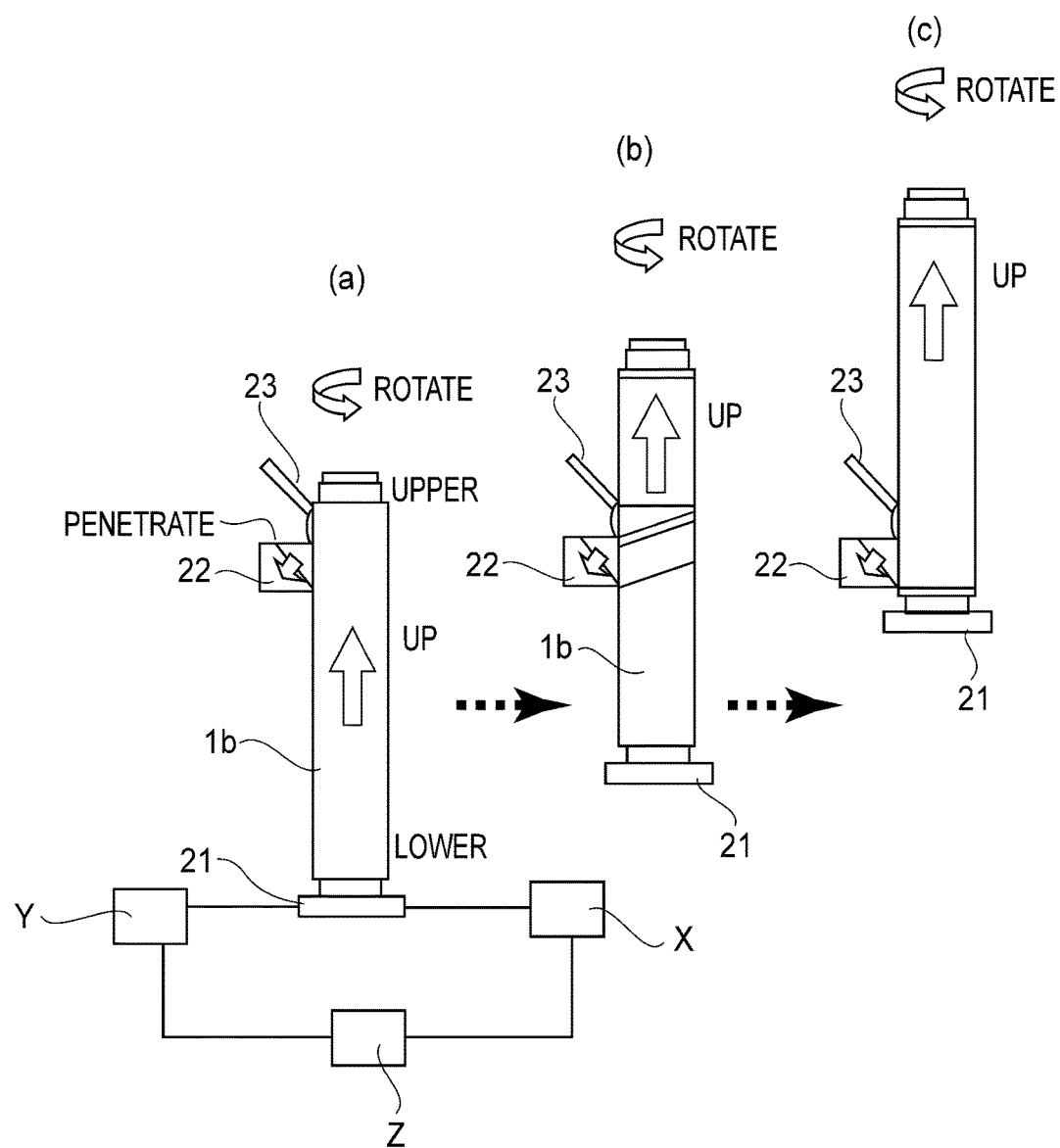

Parts (a), (b) and (c) of FIG. 4 are schematic views for illustrating a member coating method.

Figure 5:
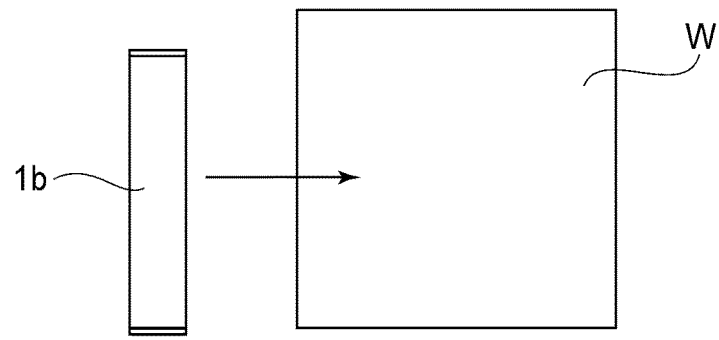

FIG. 5 is a schematic view for illustrating a drying and baking step of a primer layer.

Figure 6:
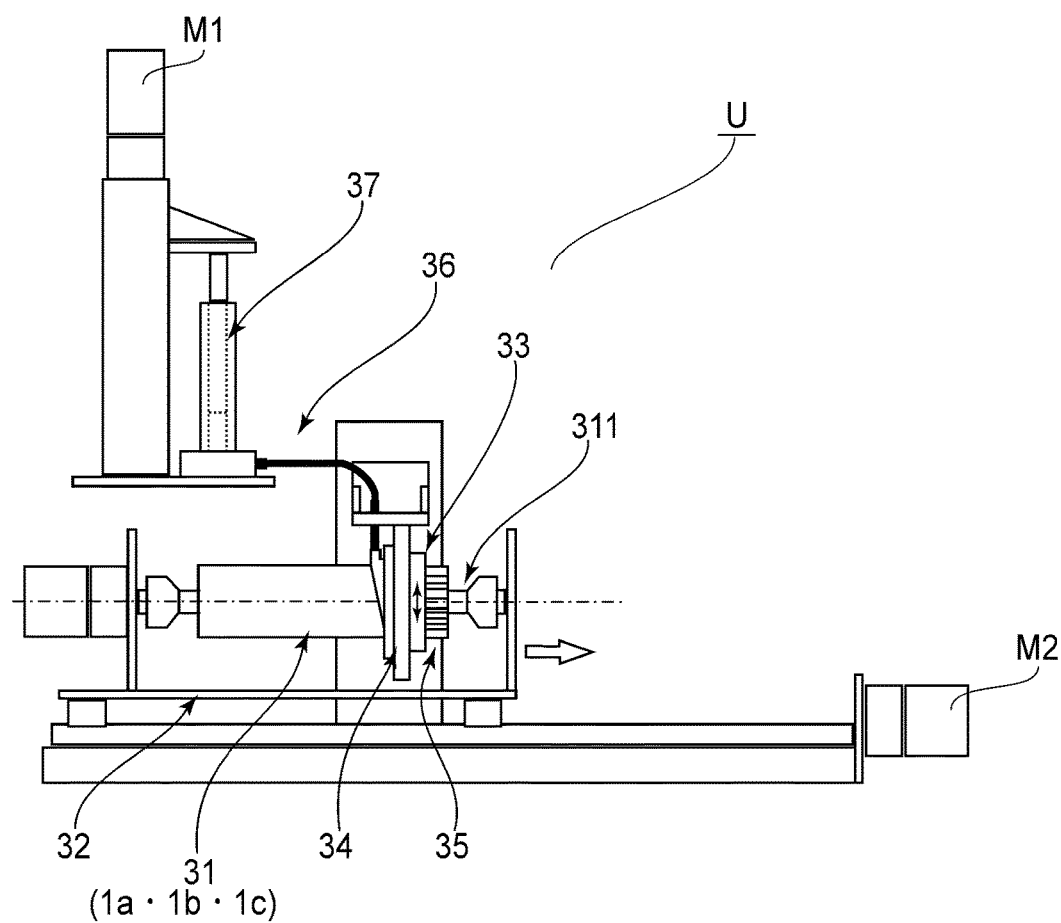

FIG. 6 is a schematic view of a coating apparatus using a ring-coating method.

Figure 7:
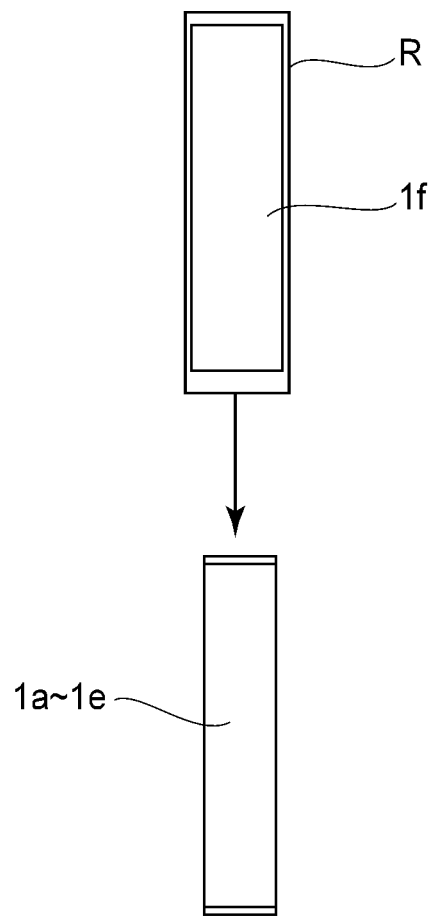

FIG. 7 is a schematic view for illustrating a rubber layer heating step.

DESCRIPTION OF THE PREFERRED EMBODIMENTS

Embodiments for carrying out the present invention will be described based on a fixing belt as a fixing member usable in a fixing device, but the present invention is not limited to these embodiments. Within the concept of the present invention, various constitutions can be replaced with known constitutions.

(1) General Structure of Image Forming Portion

Figure 1:
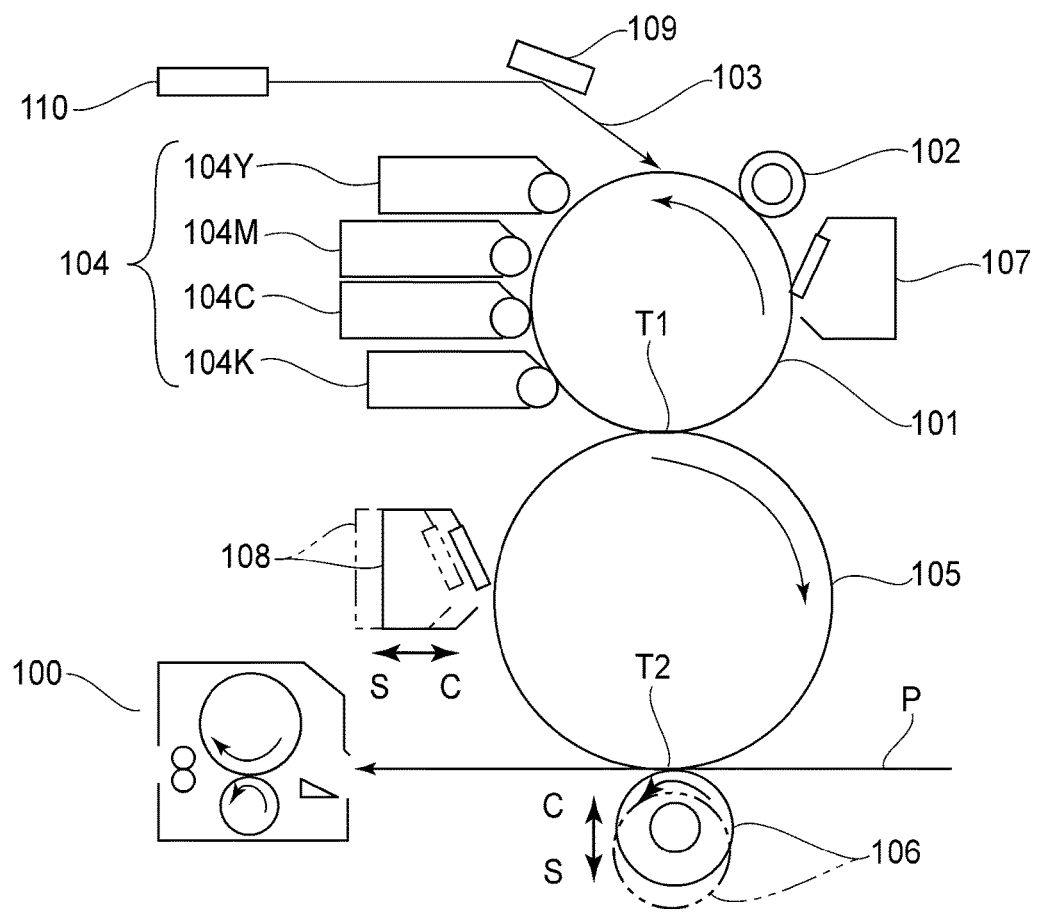
FIG. 1 is a schematic illustration of a general structure of an example of an image forming apparatus.

FIG. 1 is a schematic illustration of a general structure of an image forming apparatus used in this embodiment. The image forming apparatus is a four-color based full-color electrophotographic apparatus of one-drum type. A rotatable drum type electrophotographic photosensitive member (hereinafter, referred to as a drum) 101 as an image bearing member is rotationally driven in the counterclockwise direction of an arrow at a predetermined process speed (peripheral speed). The drum 101 is, in a rotation process thereof, electrically charged uniformly to a predetermined polarity and a predetermined potential by a charging device 102 such as a charging roller.

Then, the charged surface of the drum 101 is exposed to laser light 103, on the basis of inputted image information, outputted from a laser optical system 110. The laser optical system 110 outputs the laser light 103 modulated correspondingly to a time-series electric digital pixel signal of color image information from an image signal generating circuit such as an unshown image reading device, thus subjecting the surface of the drum 101 to scanning exposure. As a result, by the scanning exposure, on the surface of the drum 101, an electrostatic latent image corresponding to the image information is formed. T output laser light 103 from the laser optical system 110 is deflected to an exposure position of the drum 101 by a mirror 109.

Then, the electrostatic latent image formed on the drum 101 is developed as a toner image by a developing device 104. In the image forming apparatus, at first, the electrostatic latent image corresponding to a yellow (Y) component image for a color image is formed on the surface of the drum 101 and then is developed as a Y toner image with a Y toner contained in a Y developing device 104Y. The Y toner image is transferred onto a surface of an intermediary transfer drum 105 at a primary transfer portion T1 as a contact portion between the drum 101 and the intermediary transfer drum 105. Incidentally, a primary transfer residual toner on the drum 101 is removed by a cleaner 107.

Then, an image forming process cycle of charging, development, exposure, development, primary transfer and cleaning as described above is executed successively with respect to a magenta (M) component image, a cyan (C) component image and a black (K) component image. That is, formation of an M toner image (by actuation of an M developing device 104M), formation of a C toner image (by actuation of a C developing device 104C) and formation of a K toner image (by actuation of a K developing device 104K) are successively executed.

As a result, on the intermediary transfer drum 105, superposed four color toner images of Y, M, C and K are formed. Incidentally, during formation of the superposed four color toner images on the intermediary transfer drum 105, a secondary transfer roller 106 and a cleaner 108 which oppose the intermediary transfer drum 105 are kept in a state ("S" in FIG. 1) in which there members are spaced from (in non-contact with) the intermediary transfer drum 105.

At predetermined contact timing somewhat before a leading end of the toner images formed on the intermediary transfer drum 105 reaches a position of the secondary transfer roller 106, the secondary transfer roller 106 is generated to the intermediary transfer drum 105 ("C" in FIG.

1) to form a secondary transfer portion (nip) T2. Further, also the cleaner 108 is contacted to the intermediary transfer drum 105 ("C" in FIG. 1).

Further, a recording material (sheet) P fed from a recording material feeding portion (not shown) is introduced into the secondary transfer portion at predetermined control timing. That is, timing when registration between a leading end of the recording material P and the leading end of the superposed four color toner images formed on the intermediary transfer drum 105 is performed in a predetermined manner, the recording material P is introduced into the secondary transfer portion T2. As a result, at the secondary transfer portion T2, the superposed from color toner images are collectively secondary-transferred from the intermediary transfer drum 105 onto the recording material P.

The recording material P coming out of the secondary transfer portion T2 is separated from the intermediary transfer drum 105 and then is introduced into an image fixing device 100 as an image heating device (apparatus), so that unfixed toner images carried on the recording material P are subjected to fixing (image heating). Then, the recording material P subjected to the fixing is discharged to an outside of the image forming apparatus. Further, the surface of the intermediary transfer drum 105 after the separation of the recording material P is cleaned by removing a secondary transfer residual toner by the toner cleaner 108.

(2) General Structure of Fixing Device 100

Figure 2:
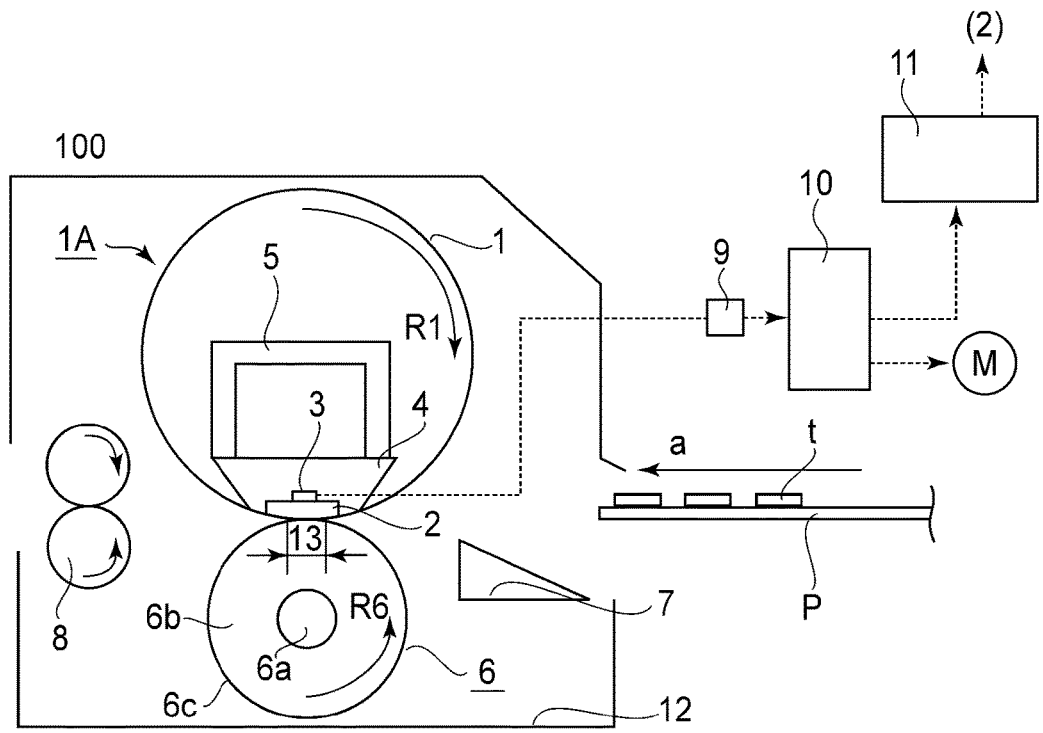
FIG. 2 is a schematic sectional view of an example of a fixing device.

FIG. 2 is a schematic illustration of a general structure of the image fixing device 100 in this embodiment. The fixing device 100 is an on-demand image heating device of a belt (film) heating type and a pressing member drive type in which a thin plate-like planar heater is used as a fixing heater (heating member: heat source). The image heating device of this type has been known in, e.g., JP-A Hei 4-44075.

The fixing device 100 is an elongated device (apparatus) in which a direction parallel to a direction perpendicular to a conveyance direction a of the recording material P is a longitudinal direction (perpendicular to the drawing sheet (FIG. 2)). The fixing device 100 roughly includes a fixing unit (heating unit) 1A, an elastic pressing roller 6 as a rotatable pressing member, and a device frame (fixing device casing) 12 in which the fixing unit 1A and the pressing roller 6 are accommodated.

The fixing unit 1A is an assembly of a heater holder 4 also functioning as a belt guide, a fixing heater 2 as the heating member, a fixing belt stay 5, a cylindrical flexible fixing belt (endless belt) 1, as the fixing member, which includes an elastic layer, and the like.

The holder 4 is an elongated member and is formed of a liquid crystal polymer (resin) having a high heat-resistant property, and performs the function of holding the heater 2 and providing the belt 1 with a shape for permitting separation of the recording material P from the belt 1.

As the heater 2, in this embodiment, a thin plate-like elongated ceramic heater is used, and is provided and held by the holder 4 along a longitudinal direction of the holder 4 at a substantially central portion of a lower surface of the holder 4. The heater 2 is abruptly increased in temperature by electric power (energy) supply. Specifically, the heater 2 includes a substrate of a alumina and thereon a heat generating resistor formed by coating in a uniform film of about 10 μm in thickness by screen printing using electroconductive paste containing silver-palladium alloy. Further, thereon, glass coating with pressure-resistant glass is made.

The glass-coated surface is a heater surface (heating surface), and the heater is held by the holder 4 at the glass-coated surface (outer surface).

The stay 5 is an elongated rigid member having a downward U-shape in cross section, and is formed of metal such as iron. The stay 5 is provided in parallel with the holder 4 in an upper surface side of the holder 4. A layer structure of the belt 1 will be specifically described later in (3). The belt 1 is externally engaged (fitted) loosely around an assembly of the holder 4, the heater 2 and the stay 5.

Further, although omitted from illustration in FIG. 2, in each of an end side and the other end side of the stay 5 with respect to the longitudinal direction, a flange member is mounted. The flange member has the functions of positional regulation (limitation) and shape retaining of the belt 1 at each of end portions in the end side and the other end side of the belt 1.

The pressing roller 6 has a multi-layer structure in which on a core metal 6a of stainless steel, an about 3 mm-thick silicone rubber layer 6b and an about 40 μm-thick PFA resin tube 6c are successively laminated in this order. The core metal 6a of the pressing roller 6 is shift-supported and held, at end portions in an end side and the other end side thereof, rotatably between side plates (not shown) in a longitudinal end side and the other longitudinal end side of the device frame 12.

The fixing unit 1A is provided in parallel with the pressing roller 6 so that the heater 2 opposes an upper side of the pressing roller 6 between the longitudinal end side plate and the other longitudinal end side plate of the device frame 12. Further, each of the flange members in the end side and the other end side is urged toward the pressing roller 6 at predetermined pressure (urging force) by a pressing (urging) mechanism (not shown).

By the above pressure, the flange members in the end side and the other end side, the stay 5 and the holder 4 are moved toward the pressing roller 6 as a whole. For that reason, the heater 2 urges the fixing belt 1 at predetermined pressure toward the pressing roller 6 against elasticity of the elastic layer 6b, so that a fixing nip 13 having a predetermined width with respect to the recording material conveyance direction a is formed between the belt 1 and the pressing roller 6.

In this embodiment, to each of the flange members in the end side and the other end side, a force of 156.8 N (16 kgf), i.e., a total pressure of 313.6 N (32 kgf) for the two flange members, is applied, so that the heater 2 is urged toward the pressing roller 6. As a result, the (lower) surface as the heating surface of the heater 2 is urged, at predetermined pressure, toward the pressing roller 6 via the belt 1 against elasticity of the elastic layer 6b of the pressing roller 6, so that the fixing nip 13 having the predetermined width necessary for the fixing is formed.

A fixing operation of the fixing device 100 is as follows. A control circuit portion (CPU) 10 as a control means actuates a fixing motor M at predetermined control timing to rotate the pressing roller 6 in the counterclockwise direction of an arrow R6 at a predetermined speed.

By the rotation of the pressing roller 6, at the fixing nip 13, a rotational torque based on a frictional force with the pressing roller 6 acts on the belt 1. As a result, the belt 1 is rotated, by the rotation of the pressing roller 6, around the holder 4 and the stay 5 in the clockwise direction of an arrow R5 at a speed substantially corresponding to the step of the pressing roller 6. Onto an inner surface of the belt 1, a semisolid lubricant is applied, so that a sliding property of the belt surface with the heater 1 and the holder 4 is ensured.

Further, the control circuit portion 10 starts electric power (energy) supply to the heater 2 from a heater driving circuit portion 11 as an electric power supplying portion. By the electric power supply, the heater 2 is quickly increased in temperature over an effective full-length region. The increase in temperature is detected by a thermistor 3 as a temperature detecting means provided in contact with a back surface (upper surface) of the heater 2. The thermistor 3 is connected with the control circuit portion 10 via an A/D converter 9.

The control circuit portion 10 effects sampling of an output from the thermistor at a predetermined interval (period), and has a constitution in which the thus-obtained temperature information is reflected in temperature control. That is, the control circuit portion 10 determines, on the basis of the output of the thermistor 3, the contents of the temperature control, and performs the function of controlling the electric power supply to the heater 2 so that the temperature of the heater 2 is a target temperature (set temperature) by the heater driving circuit portion 11.

In the above state of the fixing device, the recording material P on which the unfixed toner image t is carried is conveyed from the secondary transfer portion T2 of the image forming portion toward the fixing device 100, and then is guided by a guide member 7 into the fixing nip 13. The recording material P is then nipped and conveyed at the fixing nip 13. In a process in which the recording material P is nip-conveyed through the fixing nip 13, heat of the heater 2 is applied to the recording material P via the belt 1. The unfixed toner image t is melted by the heat of the heater 2 and then is fixed on the surface of the recording material P by pressure applied to the fixing nip 13. The recording material P coming out of the fixing nip 13 is curvature-separated from the belt 1, and then is sent to an outside of the fixing device 100 by a fixing sheet discharging roller pair 8.

(3) Layer Structure of Fixing Belt 1

Figure 3:
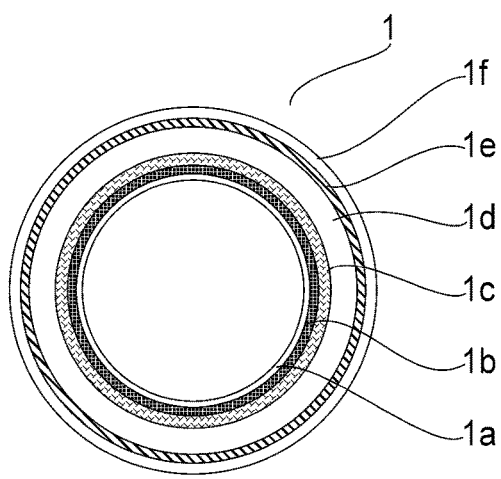
FIG. 3 is a schematic sectional view showing a layer structure of a fixing belt.

FIG. 3 is schematic cross-sectional view showing a layer structure of the fixing belt 1 in this embodiment. The fixing belt 1 includes a cylindrical substrate (endless member) 1b, an inner surface slidable layer 1a provided on an inner peripheral surface of the cylindrical substrate 1b, and a primer layer (coat layer, adhesive layer) 1c which coats an outer peripheral surface of the cylindrical substrate 20a. A silicone rubber elastic layer (rubber layer) 1d is formed on an outer peripheral surface of the cylindrical substrate 1b via the primer layer 1c, and a fluorine-containing resin tube 1f as a fluorine-containing resin layer is provided over the silicone rubber elastic layer 1d via a silicone rubber adhesive layer 1e.

The belt 1 in this embodiment is a laminated composite layer member having the above-mentioned 6 layers, and is a thin member having flexibility as a whole and low thermal capacity. Further, the fixing belt 20 holds a substantially cylindrical shape in a free state thereof. Incidentally, the fixing belt 1 includes at least the silicone rubber elastic layer 1d over the outer peripheral surface of the cylindrical substrate 1b on which a primer (coat liquid, adhesive liquid) is applied (coated). The respective constituent layers will be specifically described below.

(3-1) Cylindrical Substrate 1b

The fixing belt 1 is required to have heat resistance (property), and therefore the cylindrical substrate 20b may preferably be formed of a material which is considered in terms of properties of heat resistance and flexing resistance. For example, as the material, it is possible to use metals such as aluminum, iron, nickel or copper; alloys of these metals; heat-resistant resins such as polyimide resin, polyamide resin, polyether ether ketone resin or polyamide imide resin; and polymer alloys of these resins.

In this embodiment, as the cylindrical substrate 1b, an endless metal cylindrical substrate which is formed of nickel-iron alloy and which is formed of 30 mm in inner diameter, 40 µm in thickness and 400 mm in length as disclosed in WO 2005/054960 A1 was used.

(3-2) Inner Surface Slidable Layer 1a

As a material for the inner surface slidable layer 1a, a resin material, such as polyimide resin, having high durability and high heat resistance is suitable. In this embodiment, a polyimide precursor solution obtained by reaction, in an organic polar solvent, of aromatic tetracarboxylic dianhydride or its derivative with aromatic diamine in a substantially equimolecular amount was used. The solution is applied onto the inner surface of the cylindrical substrate 1b, and then is dried and heated to form a polyimide resin layer by dewatering cyclization reaction. The thus-prepared polyimide resin layer is used as the inner surface slidable layer 1a.

Specifically, in this embodiment, as the polyimide precursor solution, a solution of a polyimide precursor, in N-methyl-2-pyrrolidone, obtained from 3,3',4,4'-biphenyltetracarboxylic dianhydride and para-phenylenediamine was used. Then, a 15 µm-thick the polyimide resin layer is formed and is used as the inner surface slidable layer 1a.

(3-3) Silicone Rubber Elastic Layer 1d

The silicone rubber elastic layer 1d is formed over the outer peripheral surface of the cylindrical substrate 1b via the primer layer 1c. The silicone rubber elastic layer 1d functions as an elastic layer, to be carried by the fixing member, for applying uniform pressure to an uneven (projection/recess) portion generated between the toner image and the recording material P (sheet) during the fixing. In order to achieve the function, the silicone rubber elastic layer 1d is not limited particularly, but in view of processing property, the elastic layer 20d may preferably be prepared by curing a silicone rubber of an addition curing type. This is because elasticity of the silicone rubber elastic layer 1d can be adjusted by adjusting a degree of crosslinking of the silicone rubber depending on a type and addition amount of a filler described later.

In general, the addition curing type silicone rubber contains organopolysiloxane having an unsaturated aliphatic group, organopolysiloxane having active hydrogen bonded to silicon, and a platinum compound as a crosslinking catalyst.

The organopolysiloxane having active hydrogen bonded to silicon forms a crosslinking structure by reaction with an alkenyl group of the organopolysiloxane (component) having the unsaturated aliphatic group by the action of the catalyst of the platinum compound.

The silicone rubber elastic layer 20d may contain the filler for improving a heat conduction property, a reinforcing property and a heat resistance property of the fixing member.

Particularly, for the purpose of improving the heat conduction property, the filler may preferably have a high heat conduction property. Specifically, as the filler, it is possible to use an inorganic substance, particularly metal and a metal compound.

Specific examples of the high heat conductive filler may include silicon carbide (SiC), silicon nitride ($Si_3N_4$), boron nitride (BN), aluminum nitride (AlN), alumina ($Al_2O_3$), zinc oxide (ZnO), magnesium oxide (MgO), silica (SiO$_2$), copper (Cu), aluminum (Al), silver (Ag), iron (Fe), nickel (Ni) and the like.

These materials can be used singly or in mixture of two or more species. An average particle size of a high heat conductive filler may preferably be 1 µm or more and 50 µm or less from the viewpoints of handling and dispersibility. Further, as a shape of the filler, it is possible to use a spherical shape, a pulverized shape, a needle shape, a plate shape, a whisker shape and the like, but the spherical shape is preferred from the viewpoint of the dispersibility.

From the viewpoints of contribution to surface hardness of the fixing member and efficiency of heat conduction to the unfixed toner during the fixing, a preferred range of the thickness of the silicone rubber elastic layer 1d is 100 µm or more and 500 µm or less, particularly 200 µm or more and 400 µm or less.

(3-4) Primer Layer 1c

Primer treatment refers to formation, on the surface of the cylindrical substrate 1b, of the primer (coat liquid, adhesive liquid) for bonding the cylindrical substrate 1b and the silicone rubber elastic layer 1d in a state in which an adhesive performance can be achieved.

A material constituting the primer layer 1c is required to have a softening point and a melting point which are lower than those of the materials for the inner surface slidable layer 1a, the cylindrical substrate 1b and the fluorine-containing resin surface layer 1f and to have good wettability with the cylindrical substrate 1b compared with the silicone rubber elastic layer 1d. For example, as the material for the primary layer 1c, it is possible to use a hydroxyl-based (Si—H based) silicone primer, a vinyl-based silicone primer, an alkoxy-based silicone primer, and the like. With respect to the hydroxyl-based (Si—H based) silicone primer and the vinyl-based silicone primer, the primer is bonded to the silicone rubber elastic layer 1d by addition polymerization crosslinking. With respect to the alkoxy-based silicone primer, the primer is bonded to the silicone rubber elastic layer 1d by condensation polymerization crosslinking.

More specifically, the silicone primer is a mixture of a primer composition as a silane coupling agent with an organic solvent.

The primer composition is divided into an adhesive component and a film-forming component in many cases. Examples of the adhesive component may include organo-alkoxysilane having alkenyl group, organoalkoxypolysiloxane resin, and the like.

Specifically, the adhesive component is an organosilicon compound having, in a molecule shown below, both of a reactive group (such as alkoxy group or silanol group) to be chemically bonded to the inorganic substance and a reactive group (such as vinyl group, epoxy group, methacrylic group, acrylic group, amino group or mercapto group) to be chemically bonded to an organic material.

Examples of the molecule may include vinyltrimethoxysilane, vinyltriethoxysilane, γ-methacryloxypropyltrimethoxysilane, γ-glycidoxypropyltrimethoxysilane, γ-aminopropyl-triethoxysilane, and γ-mercaptopropyltrimethoxysilane.

Examples of the film-forming component may include an organosilicon compound having alkoxy group, silanol group or the like in a large amount, and may specifically include tetraethoxysilane and the like. The silanol group in the primer (in this case, alkoxy group is converted into silanol group by hydrolysis) performs the function of forming a film by being chemically bonded to the silanol group of the primer layer itself, the silanol group of the silicone rubber elastic layer or the inorganic substance.

As the solvent for the primer composition, an easy-volatilizable solvent is preferred. Examples of the solvent may include alcohols such as methanol, ethanol and isopropanol; aromatic hydrocarbon solvents such as toluene; aliphatic hydrocarbon solvents such as heptane, n-hexane, cyclohexane, methylcyclohexane and dimethylcyclohexane; ketone solvents such as acetone and methyl ethyl ketone; and ester solvents such as ethyl acetate.

These solvents may be used singly or in mixture of two or more species. With respect to an addition amount of the solvent, depending on a coating method of the primer composition, the addition amount may appropriately be adjusted so as to provide a proper concentration of the primer composition. The solvent amount in the primer composition may desirably be two times or more the amount of the component other than the solvent, on a weight basis, so that thickness non-uniformity can be made less when the silicone primer is coated on the cylindrical substrate 1b.

Parts (a), (b) and (c) of FIG. 4 are schematic views for illustrating a coating (applying) method of the present primer layer 1c. Flow of a series of steps in the coating method is as follows.

As shown in (a) of FIG. 4, the cylindrical substrate 1b having a predetermined outer diameter is fixed on a work 21 as a rotating jib (holding member). The work 21 is, as described later, configured to be movable upward and downward while being rotated in a state in which the work 21 holds the cylindrical substrate 1b.

The work 21 has an outer diameter corresponding to the inner diameter of the cylindrical substrate 1b, and is a columnar or cylindrical member for holding the cylindrical substrate 1b by externally engaging the cylindrical substrate 1b with the work 21. As shown in FIG. 4, the work 21 is provided in a vertical attitude in which a rotational axis direction of the work 21 is substantially parallel with the direction of gravitation. In a state in which the vertical attitude is held, the work 21 is rotationally driven at a predetermined speed (e.g., 215 rpm) by a rotating mechanism X, and at the same time, the work 21 is moved upward and downward at a predetermined step by an up-and-down moving mechanism Y. The rotating mechanism X and the up-and-down moving mechanism Y are constituted so that their operations are controlled by a controller Z. Here, when the cylindrical substrate 1b is externally engaged with and fixed on the work 21 held in the vertical attitude, an upper side of the cylindrical substrate 1b is defined as an upper end portion side, and a lower side of the cylindrical substrate 1b is defined as a lower end portion side.

Then, a primer coating (applying) member 22 which is an impregnation member impregnated with a primer is contacted to the cylindrical substrate 1b, in the upper end portion side, which is externally engaged with and fixed on the work 21. The primer is directly added dropwise continuously at a certain speed onto an outer surface of the cylindrical substrate 1b from a nozzle 23, as a nozzle member for ejecting the primer, located above the primer coating member 22 with a gap (spacing).

Here, a diameter of the nozzle 23 may desirably be 1-3 mm in which the primer (coating liquid) can be stably supplied by a constant feeding means, for the coat liquid, such as a tube disperser (not shown). A gap between the cylindrical substrate 1b and the nozzle 23 may desirably be 0-10 mm. When the gap is made than 10 mm, ejection pressure is required to be increased in order to directly and the primer dropwise onto (delivered to) the outer surface of the cylindrical substrate 1b, and therefore scattering of the coating liquid is problematic.

Further, when the gap between the primer coating member 22 and the nozzle 23 is excessively small, the primer ejected from the nozzle 23 is absorbed by the primer coating member 22 before thin film formation on the outer surface of the cylindrical substrate 1b by shearing force with respect to a rotational direction described later is made. For that reason, the gap may desirably be 5 mm or more.

Then, as shown in (a), (b) and (c) of FIG. 4, the work 21 is moved upward at a certain speed while being rotated at the predetermined speed (e.g., 215 rpm), so that the primer is applied onto the outer surface of the cylindrical substrate 1b, externally engaged with and fixed on the work 21, from the upper end portion side toward the lower end portion side.

In this case, onto the outer surface of the cylindrical substrate 1b, the primer is applied spirally first by pressing with the primer coating member 22. However, immediately thereafter, the primer added dropwise onto the cylindrical substrate 1b is extended by the shearing force with respect to the rotational direction to form a thin film, and thus the primer layer is superposed by coating, so that a degree of spiral trace at an initial coating surface is reduced.

Further, onto the primer coating member 22, the primer is added dropwise along the cylindrical substrate 1b, and therefore a portion where the primer coating member 22 is contacted to the cylindrical substrate 1b is in a state in which the primer coating member 22 always contains the member. In this state, the primer is continuously supplied (fed) while suppressing dripping of the primer, added dropwise along the surface of the cylindrical substrate 1b, by the primer coating member 22.

At ejection amount of the primer added dropwise from the nozzle 23 onto the cylindrical substrate 1b is set at 0.3 ml/sec in this embodiment since a constitution in which the primer in a stable amount is also supplied to the primer coating member 22 via the cylindrical substrate 1b while forming the time film on the outer surface of the cylindrical substrate 1b is employed. This primer ejection amount may only be required to be appropriately adjusted depending on the diameter of the cylindrical substrate 1b. In this embodiment, the cylindrical substrate 1b has a diameter of 30 mm. Incidentally, a constitution in which a mechanism (nozzle) for ejecting the primer is separately provided and directly supplies the primer to the primer coating member 22, thus impregnating the primer coating member 22 with the primer may also be employed. In this constitution, the two mechanisms for ejecting the primer are needed, and therefore the above-described constitution in which the primer is supplied from the single nozzle to the cylindrical substrate 1b and the primer coating member 22 may preferably be employed.

Further, the primer coating member 22 is a roll-shaped sponge and feed a fresh surface thereof at a predetermined speed with the upward movement of the work 21, thus suppressing the influence of a change with time of the contact surface thereof by abrasion (wearing) of the primer coating member 22.

FIG. 5 is a schematic view for illustrating a step of drying and baking the primer. Thereafter, as shown in FIG. 5, the primer applied onto the outer surface of the cylindrical substrate 1b as described above is left standing for a certain time to be naturally dried, and thereafter the coated cylindrical substrate 1b is placed in a high-temperature furnace W as a heating mechanism (baking mechanism) to bake the primer layer formed by the coat.

The above-described coating method can control a film thickness of the primer layer, to be finally obtained, by a pressing force of the primer coating member 22, a viscosity of the primer and the ejection amount of the primer ejected from the nozzle 23.

By using such a coating method, it is possible to coat the cylindrical substrate 1b with the primer layer 1c satisfying surface smoothness, adhesive property and mass-productivity.

It is also possible to employ a means constitution in which the rotating jig 21 holding the cylindrical substrate 1b is rotated but is not moved upward and downward, and the primer coating member 22 and the nozzle 23 are moved upward and downward relative to the rotating jig 21. That is, a moving means for moving the primer coating member 22 and the primer ejecting nozzle 23 relative to the cylindrical substrate 1b in the longitudinal direction of the cylindrical substrate 1b.

Then, the primer coating member 22 is pressed against the outer surface of the cylindrical substrate 1b rotated by the rotating jig 21, and at the same time, the primer coating member 22 and the cylindrical substrate 1b are moved relative to each other in the longitudinal direction by the moving means. As a result, the primer is spirally applied onto an outer peripheral surface of the cylindrical substrate 1b. After the application (coating), the primer is added dropwise from the nozzle 23 onto the primer-coated surface, so that the primer-coated surface is further coated with the primer in a thin film by the shearing force with respect to the rotational direction of the rotating cylindrical substrate 1b. The coating method in this embodiment is a primer coating method, for the cylindrical substrate, characterized in that a final primer-coated surface is obtained by such a procedure.

(3-5) Formation of Silicone Rubber Elastic Layer 1d

FIG. 6 shows an example of a step of forming the silicone rubber elastic layer 1d further over the cylindrical substrate 1b on which outer peripheral surface the primer layer 1c is formed as described above, and is a schematic view for illustrating a method using a so-called ring-coating (method).

The cylindrical substrate is coated with the silicone rubber elastic layer 1d by a coating apparatus U shown in FIG. 6. This will be described specifically. An addition curing type silicone rubber composition in which the addition curing type silicone rubber and the filler are mixed is charged into a cylinder pump 37, and then is pressure-fed. As a result, the addition curing type silicone rubber composition is applied onto the peripheral surface of a cylindrical substrate 31 (1a, 1b, 1c) from a coating liquid supply nozzle (not shown) provided inside a ring-shaped coating head 33. The coating head 33 is held by a fixed coating head holding portion 34. The cylinder pump 37 is driven by a motor M1 to press-feed the addition curing type silicone rubber composition to the coating head 33 via a tube 36.

The cylindrical substrate 31 is externally fitted and held around a cylindrical core metal held by a core metal holding tool (fixture) 311. The core metal holding tool 311 is held by a coating table 32 so that an axis thereof is horizontal, and thus is horizontally movable. The ring-shaped coating head 33 is coaxially and externally fitted around the cylindrical substrate 31. The coating table 32 is reciprocated in a horizontal axis direction of the core metal holding tool 311 at a predetermined speed by a motor M2.

Simultaneously with the coating by the coating head 33, by moving (reciprocating) the cylindrical substrate 31 in a right direction in FIG. 6, a coated film (layer) 35 of the addition curing type silicone rubber composition can be cylindrically formed on the peripheral surface of the cylindrical substrate 31.

A thickness of the coated film 35 can be controlled by a clearance between the coating liquid supply nozzle and the cylindrical substrate 31, a supplying (feeding) speed of the silicone rubber composition, a moving speed of the cylindrical substrate 31, and the like. In this embodiment, a 300 μm-thick silicone rubber composition layer 35 was obtained by setting the clearance between the coating liquid supply nozzle and the cylindrical substrate 20b at 0.8 mm, the supplying speed of the silicone rubber composition at 2.9 mm/sec, and the moving speed of the cylindrical substrate 31 at 40 mm/sec.

The addition curing type silicone rubber composition layer 35 formed on primer layer 31 is heated for a certain time by using the electric furnace W as the heating mechanism shown in FIG. 5 to cause crosslinking reaction, so that the silicone rubber elastic layer 1d can be formed.

(3-6) Fluorine-Containing Resin Surface Layer 1f

As the fluorine-containing resin layer 1f, a resin material shown below is molded into a tube shape and then is used. For example, the resin material includes a tetrafluoroethylene-perfluoroalkylvinyl ether copolymer (PFA), polytetrafluoroethylenen (PTFE), tetrafluoroethylene-hexafluoropropylene copolymer (FEP), and the like. Of these resin materials, from the viewpoints of a molding property and a toner parting property, PFA is preferred.

A thickness of the fluorine-containing resin layer 1f may preferably be 50 μm or less. This is because elasticity of the silicone rubber elastic layer 1d formed below the fluorine-containing resin layer 1f can be maintained when the fluorine-containing resin layer 1f is laminated, and thus it is possible to suppress excessively high surface hardness of the fixing member.

The inner surface of the fluorine-containing resin tube (layer) 1f can be improved in adhesive property by being subjected to sodium treatment, excimer laser treatment, ammonia treatment, or the like.

On the silicone rubber elastic layer 1d, a silicone rubber adhesive layer 1e for fixing the PFA tube 1f as the fluorine-containing resin layer is formed of a cured material of an addition curing type silicone rubber adhesive. The addition curing type silicone rubber adhesive contains an addition curing type silicone rubber in which a self-adhesive component represented by silane having a functional group, such as acryloxy group, hydrosilyl (SiH) group, epoxy group or alkoxysilyl group.

FIG. 7 is a schematic view for illustrating a coat step with the fluorine-containing resin tube 1f. As shown in FIG. 7, the cylindrical substrate (1a to 1e) is coated with the fluorine-containing resin tube by a coating apparatus R. Specifically, the coating apparatus R is a hollow cylindrical member, and the fluorine-containing resin tube 1f is held at an inner peripheral surface of the coating apparatus R. At this time, the hollow cylindrical member is placed in a vacuum state to hold the tube 1f, on the inner peripheral surface thereof, in an expanded state. Then, the tube 1f is moved as to overlap with the cylindrical substrate while being kept in the expand state.

Incidentally, the coating method with the fluorine-containing resin tube 1f may preferably employ a method as described in JP-A 2010-143118 or the like. Specifically, the method is such that the fluorine-containing resin tube is elongated in the longitudinal direction thereof and then coating with the fluorine-containing resin tube is made while applying pressure, and is desirable from the viewpoint of durability.

After the coat with the fluorine-containing resin tube 1f, the addition curing type silicone rubber adhesive is heated for a predetermined time in the electric furnace as the heating mechanism and thus is cured and bonded. As the heating mechanism for heating the fluorine-containing resin tube, the heating mechanism shown in FIG. 5 is used.

Thereafter, end portions of the resultant structure are cut in a desired length, so that the fixing belt as the fixing member can be obtained.

(4) Embodiment 1

An inner surface of a cylindrical substrate 1b which is formed of nickel-iron alloy and which is 30 mm in inner diameter, 40 mm in thickness and 343 mm in length, was coated with a polyimide precursor ("U-Varnish", manufactured by Ube Industries, Ltd.) in a thickness of 15 μm, followed by baking at 200° C. for 20 minutes to cause imidization, so that an inner surface slidable layer 1a was formed.

Thereafter, the cylindrical substrate 1b was coated with a silicone primer of a hydrosilyl type in a target thickness of 5.0 μm by the above-described coating method (FIG. 4), followed by baking at 200° C. for 5 minutes, so that a primer layer 1c was formed.

At this time, a primer composition of the silicone primer contained methacryloxypropyltrimethoxysilane as an adhesive component, tetraethoxysilane as a film-forming component, and a mixture of toluene, ethyl acetate and heptane as a solvent. As a result, a primer coat liquid prepared by adjusting these components at a mixing ratio, on a weight basis, of (adhesive component):(film-forming component): (mixture solvent)=1:1:80 was used.

Then, the outer peripheral surface of the cylindrical substrate 1b was coated with the addition curing silicone rubber in a thickness of 300 μm via the primer layer 1c, followed by baking at 200° C. for 30 minutes, so that a silicone rubber elastic layer 1d was formed.

In this case, a stock solution of the addition curing type silicone rubber was obtained by mixing the following ingredients (a) and (b) so that a ration of the number of vinyl groups to Si—H group (H/Vi) is 0.45, and then by adding the platinum compound in a catalyst amount into the mixture.

(a) vinylated polydimethylsiloxane having two or more vinyl groups per molecule (weight-average molecular weight: 100000 (polystyrene basis))

(b) hydrogen organopolysiloxane having two or more Si—H bonds per molecule (weight-average molecular weight: 1500 (polystyrene basis))

Further, the outer peripheral surface of the silicone rubber elastic layer 1d was coated with a 40 μm-thick PFA tube (manufactured by Gunze Limited) as a fluorine-containing resin surface layer 1f via the 5 μm-thick silicone rubber elastic layer 1e, followed by baking at 200° C. for 20 minutes, so that a fixing belt 1 in Embodiment 1 was prepared.

Further, as Comparison examples to the fixing belt 1 in Embodiment 1, fixing belts in Comparison examples i to iii in which preparation conditions for the layers except the primer layer were the same as those in Embodiment 1 but only the primer coating method was changed as shown in Table 1 appearing hereinafter, were prepared.

a: The fixing belt in Comparison example i was prepared by the coating method in which the ejection amount of the primer from the primer ejecting nozzle 23 was zero.

b: The fixing belt in Comparison example ii was prepared by directly adding the primer dropwise onto the primer coating member 22 without adding the primer dropwise from the primer ejecting nozzle 23 onto the cylindrical substrate 1b.

c: The fixing belt in Comparison example iii was prepared by directly adding the primer dropwise from the primer ejecting nozzle 23 onto the cylindrical substrate 1b without using the primer coating member 22 to form a thin film by shearing force with respect to a rotational direction of the cylindrical substrate 1b.

<Adhesive Property Test>

An adhesive property between the cylindrical substrate 1b and the silicone rubber elastic layer 1d (via the primer layer 1c) was evaluated by measuring a 90 degree-peeling strength.

Specifically, cutting was provided, by a feather cutter, in the silicone rubber elastic layer 1d disposed over the cylindrical substrate 1b. By a test machine, in a state in which the silicone rubber elastic layer 1d side was peeled by the test machine at a pulling speed of 1 mm/sec and in which a sample width of 10 mm, the 90-degree peeling strength at an interface between the cylindrical substrate 1b and the silicone rubber elastic layer 1d was measured at 3 positions in an upper end portion side, a central side and a lower end portion side with respect to the longitudinal. A result is also shown in Table 1.

In Embodiment 1 and Comparison example ii, high peeling strength in the neighborhood of 5.5 N was obtained over the entire longitudinal position irrespective of the upper end portion side, the central side and the lower end portion side.

On the other hand, in Comparison example i, a difference in peeling strength was founded depending on the longitudinal position, and in the lower end portion side, low peeling strength of 1.1 N was obtained, so that the adhesive property was in sufficient. This is because in Comparison example i, the cylindrical substrate is sufficiently coated with the primer in the upper end portion side as a primer coating start position, whereas the primer contained in the primer coating member 22 is gradually depleted with progression of the coating.

Further, in Comparison example iii, there was no variation of the peeling strength at the longitudinal, but somewhat low peeling strength in the neighborhood of 4.0 N was obtained over the entire longitudinal position.

Here, a difference between Embodiment 1 and Comparison example iii is only in that whether or not the pressing step by the primer coating member 22 is performed, and therefore it is confirmed that the pressing step by the primer coating member 22 largely affects the adhesive property.

<Thickness Measurement>

A variation of a total thickness of the fixing belt at respective stages in preparation of the fixing belt was measured by a laser length-measuring device. Specifically, the stages are three stages of after formation of the primer layer 1c, after formation of the silicone rubber elastic layer 1d and after formation of the fluorine-containing resin surface layer 1f. At each stage, the total thickness was measured in 3 longitudinal positions in the upper end portion side, the central side and the lower end portion side with respect to the longitudinal direction for each of 8 circumferential positions each spaced by 45 degrees, i.e., in 24 positions in total. The variation of the total thickness was evaluated by a value ($\Delta$) which is (maximum)−(minimum). A result is also shown in Table 1.

In Embodiment 1 and Comparison example iii, at the stage at the time of completion of the fixing belt after the fluorine-containing resin layer formation, the thickness non-uniformity ($\Delta$) was 2.5 μm or less, so that the fixing belt with high accuracy was obtained.

On the other hand, in Comparison examples i and ii, the thickness non-uniformity was 8 μm or more which was large. This is because in Comparison example i, as described above, the cylindrical substrate is sufficiently coated with the primer in the upper end portion side as a primer coating start position, whereas the primer contained in the primer coating member is gradually depleted with progression of the coating.

Further, in Comparison example ii, it would be considered that the primer is dripped in the lower end portion side by the influence of the viscosity of the primer excessively applied in the upper end portion side, and is backed in that state to generate the thickness non-uniformity with respect to the longitudinal direction. Further, it would be also considered that a spiral trace generated due to an edge portion of the coating member 22 takes part in generation of the thickness non-uniformity.

Further, the total thickness non-uniformity is not so changed at the respective stages of after the primer layer formation, after the silicone rubber elastic layer formation and after the fluorine-containing resin surface layer formation, and therefore it is also confirmed that the influence of the accuracy of the primer coating on the total thickness of the fixing belt is large.

<Real Machine Sheet Passing Durability Test>

Each of the fixing belts in Embodiment 1 and Comparative examples i to iii was mounted in a full-color copying machine ("iR-ADVANCE C5051", manufactured by Canon Kabushiki Kaisha), and then an image formation durability test was conducted. Setting of condition was made so that pressure was 250 N, a fixing nip was 8 mm×310 mm, a fixing temperature was 190° C., and a process speed was 246 mm/sec. A result is also shown in Table 1.

In Embodiment 1 and Comparison example ii, even after 300,000 sheets (estimated lifetime) were outputted, there was no interfacial peeling with respect to the silicone rubber elastic layer, so that there was no problem of the adhesive property. However, from the viewpoint of image quality, in Comparison example ii, when a halftone image or the like was outputted, it was confirmed that image non-uniformity due to the fixing belt thickness non-uniformity in some cases.

In Comparison example i, the interfacial peeling from the lower end portion side of the silicone rubber was observed at the time when 20,000 sheets were outputted. This is presumably because the adhesive property in the lower end portion side is weak.

Also in Comparison example iii, the interfacial peeling from the lower end portion side of the silicone rubber elastic layer was observed at the time when 100,000 sheets were outputted. This is presumably because the adhesive property in the lower end portion side is weak when compared with those in Embodiment 1 and Comparison example ii.

TABLE 1

| Item | Content | EMB. 1 | CEi*1 | CEii*2 | CEiii*3 |
|---|---|---|---|---|---|
| Primer | PE*6 | DOCS | NO | DOCM | DOCS |
| Coating | PCM*7 | YES | YES | YES | NO |

TABLE 1-continued

| Item | Content | EMB. 1 | CEi*1 | CEii*2 | CEiii*3 |
|---|---|---|---|---|---|
| Peeling | U*8 | 5.6 | 5.1 | 5.1 | 4.0 |
| | C*9 | 5.5 | 2.9 | 5.4 | 3.9 |
| | L*10 | 5.6 | 1.1 | 5.5 | 4.1 |
| TN*4 | PL*11 | 2.2 | 10.2 | 10.1 | 2.2 |
| (μm) | EL*12 | 2.3 | 9.7 | 9.3 | 2.2 |
| | SL*13 | 2.4 | 9.8 | 8.8 | 2.4 |
| RMD*5 | RB*14 | OK300 | NG20 | OK300 | NG100 |
| | IQ*15 | Good | NG | NG | NG100 |

*1"CE i" represents Comparison example i.
*2"CE ii" represents Comparison example ii.
*3"CE iii" represents Comparison example iii.
*4"TN" represents the thickness non-uniformity Δ (μm).
*5"RMD" represents the real machine durability (test).
*6"PE" represents the primer ejection from the primer ejection nozzle. "DOCS" shows that the primer is added dropwise onto the cylindrical substrate. "NO" shows that the primer was not added dropwise. "DOCM" shows that the primer is added dropwise onto the primer coating member.
*7"PCM" represents the primer coating member. "YES" shows that the primer coating member is used. "NO" shows that the primer coating member is not used.
*8"U" represents the upper end portion side.
*9"C" represents the central side.
*10"L" represents the lower end portion side.
*11"PL" represents the time after the primer layer formation.
*12"EL" represents the time after the silicone rubber elastic layer formation.
*13"SL" represents the time after the fluorine-containing resin layer formation.
*14"RB" represents the rubber. "OK300" shows that good durability is obtained after 300,000 sheets. "NG20" and "NG100" show that the interfacial peeling is observed at the times of 20,000 sheets and 100,000 sheets, respectively.
*15"IQ" represents the image quality. "GOOD" shows that there is no image non-uniformity. "NG" shows that image non-uniformity conspicuous on the halftone image. "NG100" shows that image non-uniformity is observed after 100,000 sheets.

(5) Embodiment 2

A fixing belt was prepared in the same manner as in Embodiment 1 except that the mixing ratio of the silicone primer coating liquid in Embodiment 1 was changed to (adhesive component):(film-forming component):(mixture solvent)=1:1:10.

The thus-prepared fixing belt was subjected to the adhesive property test, the thickness measurement and the real machine durability test in the same manner as those in Embodiment 1. A result is shown in Table 2 appearing hereinafter.

(6) Embodiment 3

A fixing belt was prepared in the same manner as in Embodiment 1 except that the mixing ratio of the silicone primer coating liquid in Embodiment 1 was changed to (adhesive component):(film-forming component):(mixture solvent)=1:1:20.

The thus-prepared fixing belt was subjected to the adhesive property test, the thickness measurement and the real machine durability test in the same manner as those in Embodiment 1. A result is also shown in Table 2.

(7) Embodiment 4

A fixing belt was prepared in the same manner as in Embodiment 1 except that the mixing ratio of the silicone primer coating liquid in Embodiment 1 was changed to (adhesive component):(film-forming component):(mixture solvent)=1:1:40.

The thus-prepared fixing belt was subjected to the adhesive property test, the thickness measurement and the real machine durability test in the same manner as those in Embodiment 1. A result is also shown in Table 2.

(8) Embodiment 5

A fixing belt was prepared in the same manner as in Embodiment 1 except that the mixing ratio of the silicone primer coating liquid in Embodiment 1 was changed to (adhesive component):(film-forming component):(mixture solvent)=1:1:60.

The thus-prepared fixing belt was subjected to the adhesive property test, the thickness measurement and the real machine durability test in the same manner as those in Embodiment 1. A result is also shown in Table 2.

In Embodiments 2 to 5, in the adhesive property test, the peeling strength (N) was high peeling strength of 5.5 N or more over the entire longitudinal region.

With respect to the thickness non-uniformity, it is understood that the primer is applied with high accuracy such that the thickness non-uniformity (Δ) is within 3.0 μm or less. Further, the thickness non-uniformity value is smaller with a larger dilution ratio of the mixture solvent.

In the real machine durability test, even after 300,000 sheets (estimated lifetime) were outputted, there was no interfacial peeling or the like with respect to the silicone rubber elastic layer, so that there was no problem of the adhesive property. Further, also with respect to the image quality, there was no image non-uniformity.

TABLE 2

| Item | Content | E2*1 | E3*2 | E4*3 | E5*4 |
|---|---|---|---|---|---|
| PC*5 | MR*8 | 1:1:10 | 1:1:20 | 1:1:40 | 1:1:60 |
| Peeling | U*9 | 5.8 | 5.6 | 5.6 | 5.6 |
| | C*10 | 5.7 | 5.6 | 5.5 | 5.5 |
| | L*11 | 5.7 | 5.6 | 5.5 | 5.6 |
| TN*6 | PL*12 | 2.9 | 2.7 | 2.5 | 2.3 |
| (μm) | EL*13 | 3.0 | 2.6 | 2.3 | 2.3 |
| | SL*14 | 2.8 | 2.6 | 2.4 | 2.4 |
| RMD*5 | RB*15 | OK300 | OK300 | OK300 | OK300 |
| | IQ*16 | Good | Good | Good | Good |

*1"E2" represents Embodiment 2.
*2"E3" represents Embodiment 3.
*3"E4" represents Embodiment 4.
*4"E5" represents Embodiment 5.
*5"PC" represents the primer coating.
*6"TN" represents the thickness non-uniformity Δ (μm).
*7"RMD" represents the real machine durability (test).
*8"MR" represents the mixing ratio of the mixture solvent on the weight basis.
*9"U" represents the upper end portion side.
*10"C" represents the central side.
*11"L" represents the lower end portion side.
*12"PL" represents the time after the primer layer formation.
*13"EL" represents the time after the silicone rubber elastic layer formation.
*14"SL" represents the time after the fluorine-containing resin layer formation.
*15"RB" represents the rubber. "OK300" shows that good durability is obtained after 300,000 sheets.
*16"IQ" represents the image quality. "GOOD" shows that there is no image non-uniformity.

Here, in the present invention, as the fixing device heating device or apparatus), in addition to an apparatus for fixing or temporarily fixing the toner image as a fixed image by heating the toner image by using the fixing member, also an apparatus for modifying a surface property such as gloss by re-heating the fixed toner image is encompassed.

Here, as the fixing member, either one or both of a member for heating the image in contact with the image-carrying surface of the recording material and a member for forming a nip together with the member for heating the image. Further, with respect to the coating method (coating apparatus) of the primer (coating liquid) as described above, if a constitution in which the coating liquid is applied onto the endless member, the coating method (coating apparatus) can be used similarly when other members are manufactured irrespective of the manufacturing of the above-described fixing member.

While the invention has been described with reference to the structures disclosed herein, it is not confined to the details set forth and this application is intended to cover such modifications or changes as may come within the purpose of the improvements or the scope of the following claims.

This application claims priority from Japanese Patent Application No. 237940/2012 filed Oct. 29, 2012, which is hereby incorporated by reference.

What is claimed is:

1. A coating apparatus configured to coat a peripheral surface of an endless member with a coating liquid, comprising:
   a holding member configured to hold the endless member;
   a nozzle member configured to eject the coating liquid onto the endless member;
   an impregnation member provided at a position lower than a free end of the nozzle member in a gravitational direction and configured to be impregnated with the coating liquid that is on the endless member, the coating liquid having been ejected from the nozzle member, through contact with the endless member;
   a rotating mechanism configured to rotate the holding member relative to the impregnation member and the nozzle member; and
   a moving mechanism configured to move the holding member relative to the impregnation member and the nozzle member in a direction substantially opposite to the gravitational direction so that the coating liquid is ejected from the nozzle member onto the endless member in a region where the endless member has already come into contact with the impregnation member.

2. The coating apparatus according to claim 1, further comprising an executing portion configured to execute a rotating operation by the rotating mechanism and a moving operation by the moving mechanism in parallel when a coating operation by the impregnation member and an ejecting operation by the nozzle member are performed.

3. A fixing member manufacturing apparatus configured to manufacture an endless fixing member including a substrate and a rubber layer provided on the substrate, comprising:
   a holding member configured to hold the substrate;
   a nozzle member configured to eject an adhesive liquid onto the substrate;
   an impregnation member provided at a position lower than a free end of the nozzle member in a gravitational direction and configured to be impregnated with the adhesive liquid that is on the substrate, the adhesive liquid having been ejected from the nozzle member, through contact with the substrate;
   a rotating mechanism configured to rotate the holding member relative to the impregnation member and the nozzle member; and
   a moving mechanism configured to move the holding member relative to the impregnation member and the nozzle member in a direction substantially opposite to the gravitational direction so that the adhesive liquid is ejected from the nozzle member onto the substrate in a region where the substrate has already come into contact with the impregnation member.

4. The fixing member manufacturing apparatus according to claim 3, further comprising an executing portion configured to execute a rotating operation by the rotating mechanism and a moving operation by the moving mechanism in parallel when a coating operation by the impregnation member and an ejecting operation by the nozzle member are performed.

5. The fixing member manufacturing apparatus according to claim 3, further comprising:
   a heating mechanism configured to heat the adhesive liquid coated on the substrate;
   a coating mechanism configured to coat the rubber layer onto the substrate on which the adhesive liquid is cured by the heating mechanism; and
   a heating mechanism configured to heat the rubber layer coated on the substrate.

6. The fixing member manufacturing apparatus according to claim 5, further comprising a coating apparatus configured to coat the rubber layer with a fluorine containing resin layer via an adhesive layer.

7. The fixing member manufacturing apparatus according to claim 6, further comprising a heating mechanism configured to heat the fluorine containing resin layer coated on the rubber layer.

* * * * *